(12) United States Patent
Kuramoto et al.

(10) Patent No.: US 7,112,888 B2
(45) Date of Patent: Sep. 26, 2006

(54) SOLDER BALL ASSEMBLY FOR BUMP FORMATION AND METHOD FOR ITS MANUFACTURE

(75) Inventors: Takeo Kuramoto, Atsugi (JP); Kaichi Tsuruta, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 10/731,436

(22) Filed: Dec. 10, 2003

(65) Prior Publication Data

US 2004/0145064 A1 Jul. 29, 2004

(30) Foreign Application Priority Data

Dec. 11, 2002 (JP) .............................. 2002-359405

(51) Int. Cl.
*H01L 23/48* (2006.01)
(52) U.S. Cl. ..................................................... 257/780
(58) Field of Classification Search ................ 257/772, 257/789, 780, 712; 438/612, 613; 228/180.22
See application file for complete search history.

(56) References Cited

U.S. PATENT DOCUMENTS 3,719,981 A * 3/1973 Steitz ........................ 438/616
5,886,415 A * 3/1999 Akagawa ................... 257/789
6,097,089 A * 8/2000 Gaku et al. ................. 257/712
6,319,810 B1 * 11/2001 Ochiai et al. ............... 438/616

FOREIGN PATENT DOCUMENTS

| JP | 08309523 | 11/1996 |
| JP | 2001-196730 | 7/2001 |

* cited by examiner

*Primary Examiner*—Carl Whitehead, Jr.
*Assistant Examiner*—Monica D. Harrison
(74) *Attorney, Agent, or Firm*—Michael Tobias

(57) ABSTRACT

A solder ball assembly for use in the formation of solder bumps on electrodes of a substrate for electronic components includes a heat-resisting sheet having a plurality of holes formed therein. Each hole has a solder ball disposed therein. The sheet includes an adherent layer exposed to the interior of each hole on the wall and/or bottom of the hole such that the adherent layer contacts and holds the solder balls in the holes. Solder bumps are formed by positioning the assembly on a substrate such that the solder balls held in the holes come into contact with the electrodes of the substrate. The assembly and the substrate are heated together to melt the solder balls in the holes. After solidification of the solder, the heat-resisting sheet of the assembly is removed from the substrate, leaving a solder bump on each electrode.

17 Claims, 4 Drawing Sheets

SOLDER BALL ASSEMBLY FOR BUMP FORMATION AND METHOD FOR ITS MANUFACTURE

BACKGROUND OF THE INVENTION

The present invention relates to a solder ball assembly for use in forming solder bumps on electrodes of a substrate for minute electrical components such as semiconductor packages and electrical connectors as well as on electrodes of a semiconductor element or other minute electrical element.

Many small electronic components, including semiconductor packages such as BGA (ball grid array) packages and CSP's (chip size packages), comprise a substrate having a semiconductor element mounted on one of its sides and having a number of electrodes formed with a prescribed arrangement on its other side or backside.

When such a semiconductor package is mounted on a printed circuit board, the electrodes on the backside of the substrate are soldered to the corresponding electrodes on the printed circuit board for electrical and mechanical connection. This soldering can be performed, for example, using solder bumps which are previously formed on each electrode of the substrate. In this case, after the electrodes of the printed circuit board have been coated with solder paste (or flux) by printing, the semiconductor package is positioned on the printed circuit board in such a manner that the electrodes of the semiconductor package are in alignment with the corresponding electrodes of the printed circuit board, thereby causing each solder bump of the package to contact the solder paste applied to the printed circuit board and holding the package on the board by the adhesion of the solder paste. The printed circuit board, which typically has a plurality of semiconductor packages or other electronic components mounted thereon in this manner, is then heated in a reflow furnace to melt the solder bumps and solder paste to perform soldering. This soldering method for mounting semiconductor packages or other electronic components on a printed circuit board will be referred to as solder bump mounting.

On the inside of such a semiconductor package, a semiconductor element is electrically connected to a substrate. The electrical connection is typically performed either by wire bonding or face down bonding.

In the wire bonding method, a semiconductor element having electrodes is secured to a substrate having corresponding electrodes with an adhesive or by soldering, and then the electrodes of the semiconductor element are electrically connected to the electrodes of the substrate through fine gold wires. Wire bonding can be performed when the semiconductor element has electrodes only along its periphery, but it can not be employed if the semiconductor element has electrodes arranged on the entire surface of one side of the element. In the latter case, if wire bonding is employed, it is difficult to prevent gold wires which are connected to electrodes in a central area of the semiconductor element from contacting gold wires which are connected to electrodes in a peripheral area of the semiconductor element, and the contact between gold wires causes short-circuiting. Another disadvantage of wire bonding is the use of fine gold wires which may be as small as several tens of micrometers in diameter. Such gold wires are extremely expensive due not only to the material cost of gold but also due to the processing costs required to form such fine wires.

In the face down bonding method, including flip chip bonding and some kinds of TAB (tape automated bonding), electrical connection is performed using solder bumps in the same manner as described above for mounting a semiconductor package on a printed circuit board. Thus, after solder bumps have previously been formed on each electrode of a semiconductor element having electrodes on one surface thereof, the semiconductor element is positioned on a substrate (which may be a printed circuit board in the case of flip chip bonding) having electrodes with the same arrangement as the electrodes on the semiconductor element such that the solder bumps of the semiconductor element are in alignment with the electrodes of the substrate. The semiconductor element and the substrate are then heated under pressure to melt the solder bumps, thereby achieving electrical connection between the semiconductor element and its substrate.

Unlike the wire bonding method, even if a semiconductor element has electrodes arranged on the entire surface of one side thereof, there is no concern of short-circuiting taking place due to contact between electrical connections connected to different electrodes on the semiconductor element. The face down bonding method is also advantageous in that the material and production costs of solder bumps are less than those of gold wires and in that all the electrodes on the semiconductor element and the substrate can be electrically connected at the same time, whereby mechanical bonding between the semiconductor element and the substrate is simultaneously achieved. As a result, face down bonding has superior productivity. Furthermore, the length of electrical connections between the semiconductor element and the substrate becomes very short and thereby minimizes a delay in transmission of electrical signals through the connections. In addition, it is possible to increase the density of electrodes or minimize the size of a semiconductor package or other electronic component.

Solder bumps useful for both the above-described solder bump mounting and face down bonding may be formed using solder balls and a mask as disclosed in JP 08-309523 A1 (1996) and JP 2001-196730 A1.

In the method disclosed in JP 08-309523 A1, through-holes having a diameter smaller than that of metal balls which are used to form metal bumps are formed in a mask with the same arrangement as solder bumps which are to be formed. An adherent sheet is attached atop the mask so as to cover the through-holes. Metal balls are then inserted into the through-holes and are held by the adherent sheet in the through-holes. The mask is then positioned on a substrate (or semiconductor element) having electrodes which have been coated with soldering flux in such a manner that the metal balls in the mask are in alignment with the electrodes of the substrate and are held in position by the adhesion of the flux coated thereon. Subsequently, the adherent sheet is peeled from the mask, and the mask is then removed, leaving the metal balls on the electrodes of the substrate. When the metal balls are made of solder, the substrate may be heated in a reflow furnace, for example, to melt the metal (solder) balls and transform them into solder bumps on the electrodes of the substrate.

In this method, after the adherent sheet and the mask are removed, the metal balls are held on the electrodes of the substrate only by the adhesion of the flux applied to the electrode. However, the adhesion of flux is relatively weak. As a result, there is the possibility of the metal balls becoming detached from the electrodes due to shaking or tilting of the substrate during transport or moving away from the electrodes as the flux flows during heating.

JP 2001-196730 A1 discloses a method comprising placing solder balls into holes formed in a mask on a tray. The diameter of the holes is slightly larger than the diameter of the solder balls, but the depth of the holes (which corresponds to the thickness of the mask) is smaller than the diameter of the solder balls. A thermally releasable sheet is then placed over the tray so as to adhere to the solder balls and hold them by the adhesion of the sheet. The sheet holding the solder balls is then pulled up to withdraw the solder balls from the mask and tray and is positioned on a substrate in such a manner that each solder ball contacts a corresponding electrode. The substrate is heated along with the solder balls and the sheet to melt the solder balls and transform them into solder bumps on the electrodes of the substrate. Finally, the thermally releasable sheet, which has lost its adhesion during heating, is removed.

According to this method, since the solder balls are heated while they are held by the thermally releasable sheet, they are to a certain degree prevented from dropping or moving during heating. However, the solder balls are held only by the sheet, which contacts the very small top areas of the balls (i.e., the balls are hanging from the sheet) before the sheet and the solder balls are positioned on the substrate. Therefore, the holding force is not sufficiently strong to prevent the solder balls from dropping from the sheet when the sheet undergoes a mechanical shock or shaking. Thus, it is necessary to perform positioning of the sheet immediately after the solder balls are withdrawn from the tray and mask, and it is practically impossible to store the thermally releasable sheet having solder balls attached thereto for ready use in bump formation at a later time.

SUMMARY OF THE INVENTION

The present invention provides a sheet for the formation of solder bumps which can hold solder balls therein so as to prevent the solder balls from dropping upon application of a mechanical shock or shaking.

The present invention also provides a solder ball assembly which includes a plurality of solder balls disposed in such a sheet and which can be stored by stacking a plurality of such assemblies on one another for ready for use to form solder bumps at a later time.

The present invention also provides a method for manufacturing the above-described assembly for the formation of solder bumps.

The present invention also provides a method for forming solder bumps from solder balls in which the solder balls are prevented from moving during heating for the purpose of transforming the solder balls into solder bumps.

The present inventors found that solder balls can be readily held in a sheet having holes for receiving solder balls and having an adherent layer for maintaining the solder balls in the holes. Solder balls can be heated to form solder bumps on a substrate while remaining in the holes if the sheet is heat-resisting, after which the sheet can be removed to leave the solder bumps on the substrate.

Thus, in one form of the present invention, a solder ball assembly for use in the formation of solder bumps includes a heat-resisting sheet having a plurality of holes formed therein. Each hole has a solder ball disposed therein. The assembly further includes an adherent layer which is exposed to the interior of each hole in such a manner that the adherent layer contacts the solder ball disposed in each hole to hold the solder ball in the hole.

The heat-resisting sheet may be made of various materials, such as a material selected from the group consisting of resins, metals, ceramics, paper, and combinations of two or more of these materials. The adherent layer may be exposed to the interior of the holes either at the bottom of each hole or on the wall of the hole. Each hole is preferably a blind (closed-end) hole, and it is typically either a straight hole having its wall extending perpendicularly to the top and bottom surfaces of the sheet or a tapered hole having a diameter which gradually decreases toward the bottom of the hole. Preferably, the solder balls held in the holes project above the top surface of the sheet. In a preferred embodiment, the depth of the holes is at least one third and more preferably at least one half the diameter of the solder balls received therein but smaller than the diameter of the solder balls. A covering, which may be non-adherent or slightly adherent, may be disposed atop the sheet to cover the solder balls.

In another form of the present invention, a method for manufacturing a solder ball assembly is provided.

In one embodiment, the method includes laminating a first and a second heat-resisting sheet with an adherent layer disposed between the two sheets to form a multilayered heat-resisting sheet having an adherent layer within the multi-layered sheet. Holes are formed in the first heat-resisting sheet, with each hole having a diameter sufficient for the hole to receive a solder ball therein and a depth sufficient for the hole to reach or pass through the adherent layer. A solder ball is placed into each hole and held therein by contact with the adherent layer which is exposed to the interior of the hole. In this case, the adherent layer is usually exposed to the interior of the hole on the wall of the hole, but it is possible for the adherent layer to be exposed to the interior of the hole at the bottom of the hole.

In another embodiment, the method includes forming through-holes in a first heat-resisting sheet, with each through-hole having a diameter sufficient to enable a solder ball to be received in the hole. The first heat-resisting sheet is laminated to a second heat-resisting sheet with an adherent layer disposed between the two sheets to form a multi-layered heat-resisting sheet having holes each with a bottom formed by the adherent layer. A solder ball is placed into each hole to hold the ball therein by contact with the adherent layer which is exposed to the interior of the hole at the bottom of the hole.

In yet another form, the present invention provides a method for forming solder bumps on electrodes of a substrate which includes preparing a solder ball assembly as described above comprising a heat-resisting sheet having a plurality of holes with the same arrangement as the electrodes. Each hole holds a solder ball therein by contact with an adherent layer exposed to the interior of the hole. The solder ball assembly is placed on the substrate, usually with the assembly upside down, in such a manner that the holes of the sheet are in alignment with the electrodes of the substrate. The substrate and the solder ball assembly placed thereon are heated to melt the solder balls and transform them within the holes in the solder ball assembly into solder bumps attached to the electrodes. The heat-resisting sheet is then removed from the substrate to leave the solder bumps on the substrate.

DESCRIPTION OF THE PREFERRED EMBODIMENTS

The present invention will next be described with respect to a number of embodiments while referring to the accompanying drawings.

Figure 1:
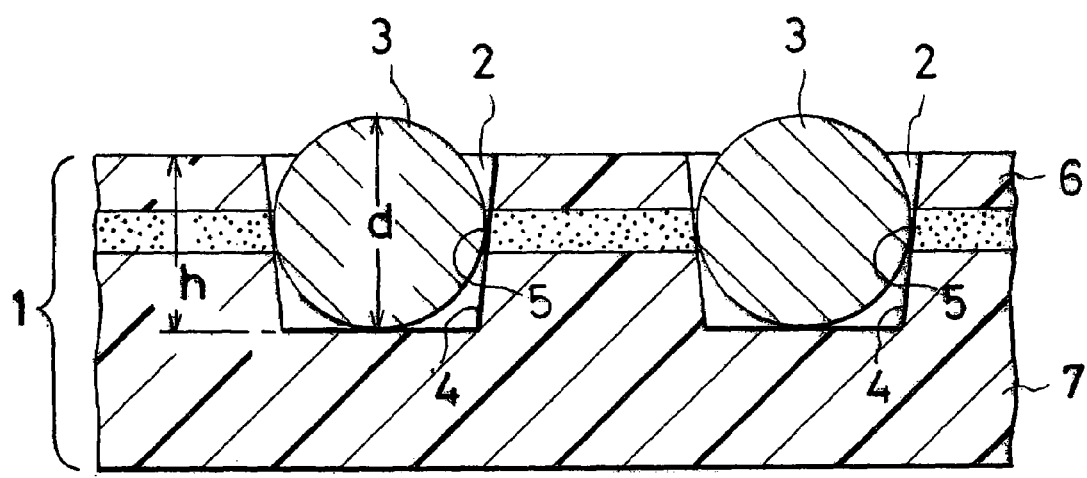
FIG. 1 is a vertical cross-sectional view of a portion of an embodiment of a solder ball assembly according to the present invention having tapered blind holes and an adherent layer which is exposed to the interior of each hole on the wall thereof.
Figure 2:
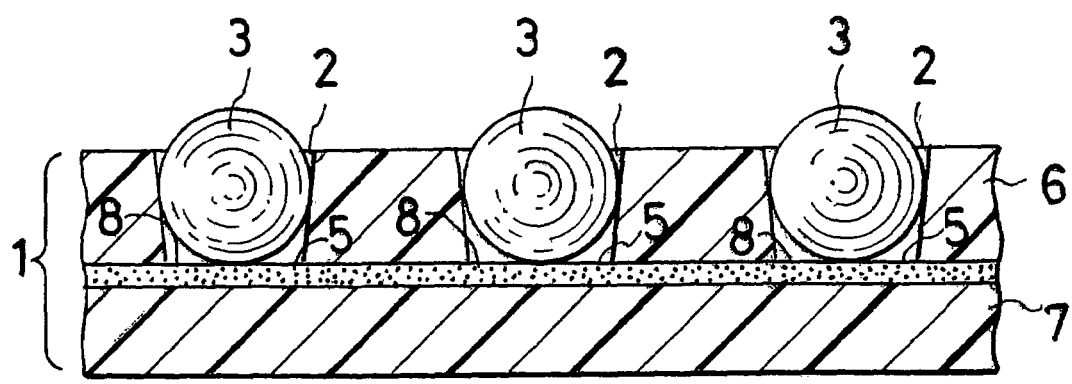
FIG. 2 is a vertical cross-sectional view of a portion of another embodiment of a solder ball assembly having tapered blind holes and an adherent layer which is exposed to the interior of each hole at the bottom thereof.
Figure 3:
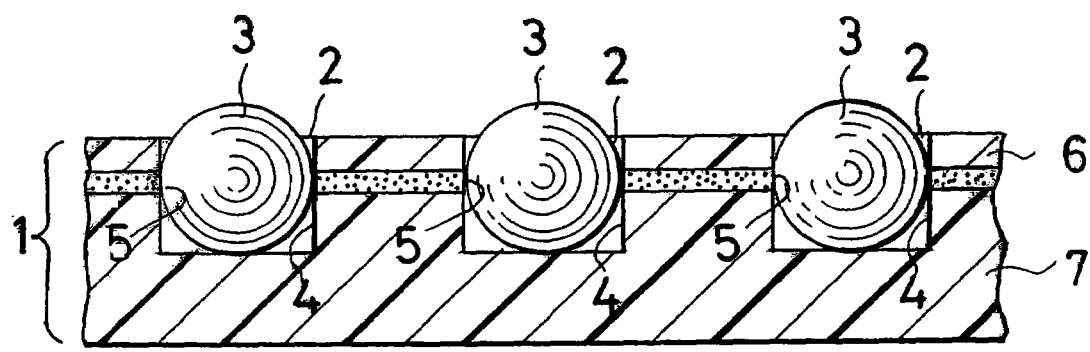
FIG. 3 is a vertical cross-sectional view of a portion of another embodiment of a solder ball assembly having straight holes and an adherent layer which is exposed to the interior of each hole on the wall thereof.

As shown in FIGS. 1 to 3, a solder ball assembly for use in bump formation according to one form of the present invention comprises a heat-resisting sheet 1 having a plurality of blind or closed-end holes 2, each hole 2 receiving a solder ball 3 therein, and an adherent layer 5 formed within the sheet 1. Thus, the heat-resisting sheet 1 generally has a sandwich or multilayered structure including a first and a second heat-resisting layer 6 and 7, which are bonded to each other by an adherent layer 5 disposed between the heat-resisting layers 6, 7. As described later, the holes 2 may be through-holes which penetrate the heat-resisting sheet 1.

The heat-resisting sheet 1 (or more accurately the first and second heat resisting layers 6, 7) may be made of any material which can withstand the heat applied to melt tiny solder balls to transform them into solder bumps without deformation or carbonization of the sheet. Thus, the sheet 1 does not need to withstand such heat over an extended period of time. Examples of suitable materials for the heat-resisting sheet 1 are resins, metals, ceramics, paper, and combinations of two or more of these materials. More preferably, the heat-resisting sheet 1 is made of a resin such as a polyester (e.g., polyethylene terephthalate or PET), polyimide, or polyetherimide resin, or a resin composite such as a glass-epoxy material (glass cloth impregnated with an epoxy resin).

The adherent layer 5 is exposed to the interior of each hole 2 formed in the heat-resisting sheet 1 in a location such that the adherent layer 5 contacts and holds the solder ball 3 in each hole 2. The adherent layer 5 may be exposed to the interior of each hole 2 either on the wall 4 of the hole 2 as shown in FIGS. 1 and 3 or on the bottom 8 of the hole 2 as shown in FIG. 2. When the adherent layer 5 is exposed to the interior of each hole 2 on the wall 4 thereof, the adherent layer 5 is placed within the heat-resisting sheet 1 such that the adherent layer 5 defines a portion of the wall 4 of each hole 2 where the wall 4 is contacted by the solder ball 3 disposed in the hole 2, thereby allowing the solder ball 3 to be held by the exposed adherent layer 5. It is also possible for the adherent layer 5 to be exposed to the interior of each hole 2 on both the bottom 8 and wall 4 of the hole 2, if two adherent layers are separately disposed in the sheet or a thick adherent layer is used.

The material of which the adherent layer is formed is selected such that it exhibits enough adhesion to bond the first and second heat-resisting layers 6, 7 to each other so as to form the multilayered heat-resisting sheet 1 and to hold solder balls 3 in the holes 2. The adherent layer may lose its adhesion during heating for bump formation. Various commercially available adhesive materials in film form may be used to form the adherent layer. Examples of useful adhesive materials include those based on an acrylic resin, a silicone resin, or a synthetic rubber.

Each hole 2 formed in the heat-resisting sheet 1 may be either a straight hole having a uniform diameter with its wall 4 extending perpendicularly to the top and bottom surfaces of the sheet 1 (i.e., vertically when the sheet 1 is horizontal) as shown in FIG. 3, or it may be a tapered hole having a diameter which gradually decreases toward the bottom of the hole as shown in FIGS. 1 and 2.

In view of facilitating insertion of a solder ball 3 into a hole 2 while minimizing misregistration of the solder ball on a substrate, it is preferred that the diameter of a straight hole be from 5 to 10 µm larger than the diameter of the solder ball. The diameter of the top opening of a tapered hole can be larger than the diameter of a straight hole. Therefore, a tapered hole has the advantage that it is relatively easy to insert a solder ball into each hole during the manufacture of a solder ball assembly. The diameter of the bottom of a tapered hole may be smaller than the diameter of the solder ball. On the other hand, a straight hole is advantageous in that it is more difficult for a solder ball held in a straight hole to become dislodged from the hole when a strong mechanical shock or shaking is applied to the ball.

The shape of the opening at the top of the hole 2 defines the shape of a solder bump formed by melting a solder bump in the hole. Therefore, the shape of this opening can be selected depending on the shape of an electrode on which a solder bump is to be formed, but it may be different from the shape of the electrode. There are cases in which a circular solder bump is formed on a square electrode, for example.

Preferably, the depth h of each hole 2 when the hole 2 is blind or the distance to which the solder ball 3 extends into the hole 2 when the hole 2 is not blind or when the solder ball 3 does not contact the bottom of the hole 2 is at least one third the diameter d of a solder ball 3 received therein (see FIG. 1). If the depth or distance h of a hole 2 is smaller than one third the diameter d of a solder ball 3 received therein, the solder ball 3 may easily become dislodged from the hole 2 when a lateral force is applied to the ball 3. In order to enhance the resistance of a solder ball 3 to such dislodgement, it is more preferable that the depth or distance h of the hole 2 be at least one half the diameter d of the solder ball 3.

It is also preferred that the depth or distance h of each hole 2 be smaller than the diameter d of the solder ball 3 so that the solder ball 3 in the hole 2 projects above the top surface of the heat-resisting sheet 1. As a result, when a solder ball assembly having solder balls 3 in its holes 2 is positioned on a substrate having electrodes with the holes 2 facing the substrate (by turning the assembly upside down from the position shown in FIGS. 1 to 3), the solder balls 3 in the assembly will always come into contact with the corresponding electrodes of the substrate, and during subsequent heating to melt the solder balls 3, the molten solder will adhere to the electrodes with certainty. The extent to which the solder balls 3 project from the heat-resisting sheet 1 considerably influences the state of contact of the resulting solder bumps with the electrodes. Thus, in order to guarantee the formation of solder bumps which sufficiently contact the electrodes of a substrate, it is advantageous for the solder balls 3 to protrude as much as possible while not protruding so much as to easily become dislodged from their holes 2. For this reason, it is preferred that the depth or distance h of each hole 2 be at most 95% and more preferably at most 90% of the diameter d of a solder ball 3 disposed in the hole 2.

In the illustrated embodiments, the holes 2 in the heat-resisting sheet 1 are blind holes, but it is also possible for the holes 2 to communicate at their lower ends with the bottom side of the heat-resisting sheet 1. For example, each hole 2 may be a tapered through-hole extending through the entire thickness of the heat-resisting sheet 1, with the adherent layer 5 exposed to the interior of each hole 2 on the wall 4 thereof. Alternatively, each hole 2 may have a bottom which is only partially closed off and which communicates with the bottom side of the heat-resisting sheet 1 through a passage. For example, the embodiments of FIGS. 1–4 could be modified by forming a passage extending between the bottom of the hole 2 receiving the solder ball 3 and the bottom side of the heat-resisting sheet 1.

Needless to say, the arrangement of the holes in a solder ball assembly according to the present invention conforms to the arrangement of electrodes of a substrate on which solder bumps are to be formed.

The solder balls 3 are not restricted to any particular material. For example, they may be made of a lead-containing solder, such as a Sn—Pb eutectic solder, or a lead-free solder, such as a Sn—Ag, Sn—Ag—Cu, Sn—Zn, or other lead-free solder. It is also possible to use metal- or resin-core solder balls each having a core of a metal, such as copper, or a resin, which is coated with solder. The diameter d of the solder balls is selected depending on the size and shape of electrodes on which solder bumps are to be formed and the desired thickness of the solder bumps.

Figure 4:
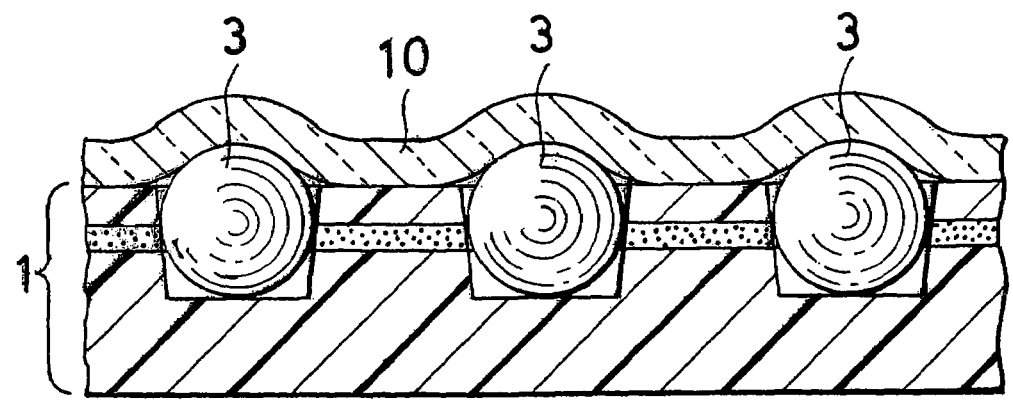
FIG. 4 is a vertical cross-sectional view of a portion of the same embodiment as in FIG. 1 in which a covering is placed atop the heat-resisting sheet to cover the solder balls.

As shown in FIG. 4, a covering 10 may be disposed atop the heat-resisting sheet 1 to cover solder balls 3 received in the holes 2. The covering 10 serves to prevent the solder balls 3 from dropping out from the holes 2 when a strong mechanical shock or shaking is applied thereto. The covering 10 also makes it easier to stack a plurality of solder ball assemblies according to the present invention for storage or transport, and it prevents the solder balls 3 from being scratched by another solder ball assembly disposed above them.

The covering 10 is typically made of a flexible material such as a plastic film. A resin-coated material formed by coating a base film such as paper, plastic film, metal foil, or a combination of these with a resin may also be used. Preferably, the covering 10 is either non-adherent or slightly adherent.

Figure 5A:
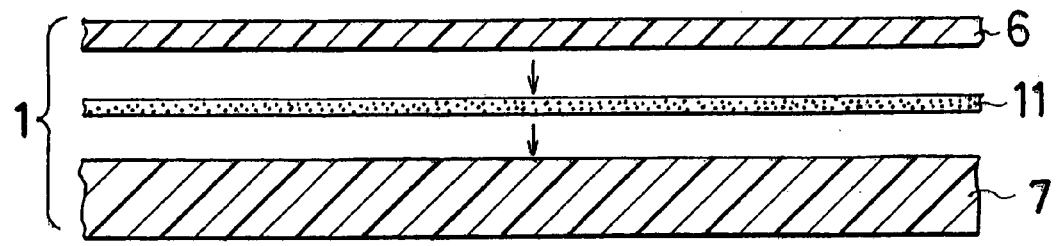
FIGS. 5A to 5C illustrate various steps of a method for manufacturing a solder ball assembly according to the present invention.
Figure 5B:
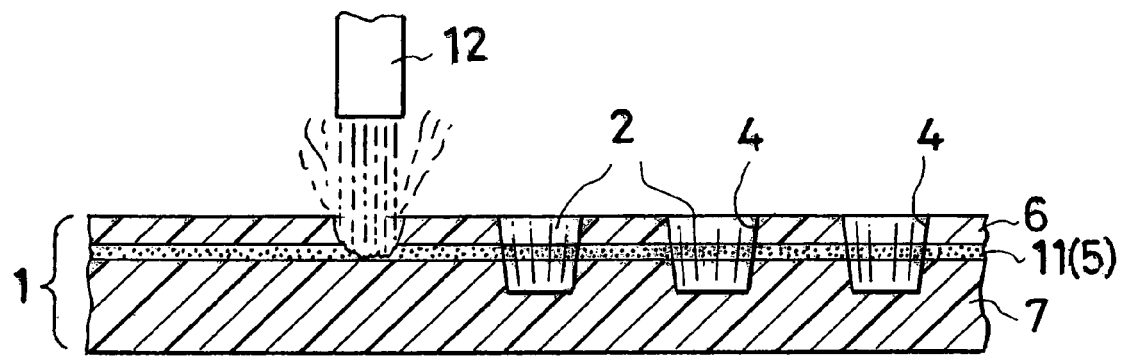
Figure 6A:
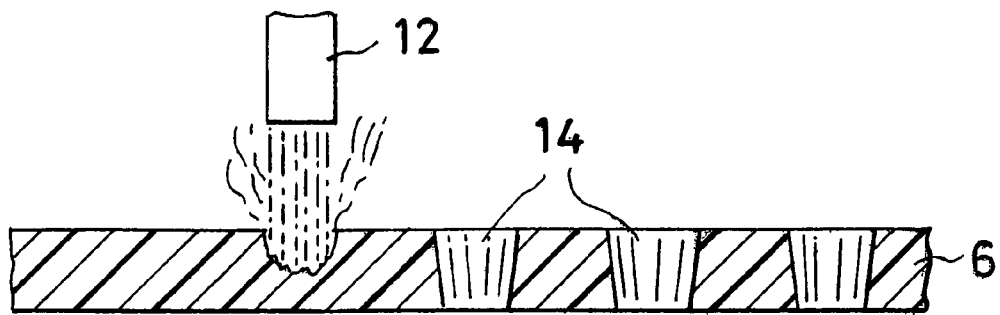
FIGS. 6A to 6C illustrate various steps of another method for manufacturing a solder ball assembly according to the present invention.
Figure 6B:
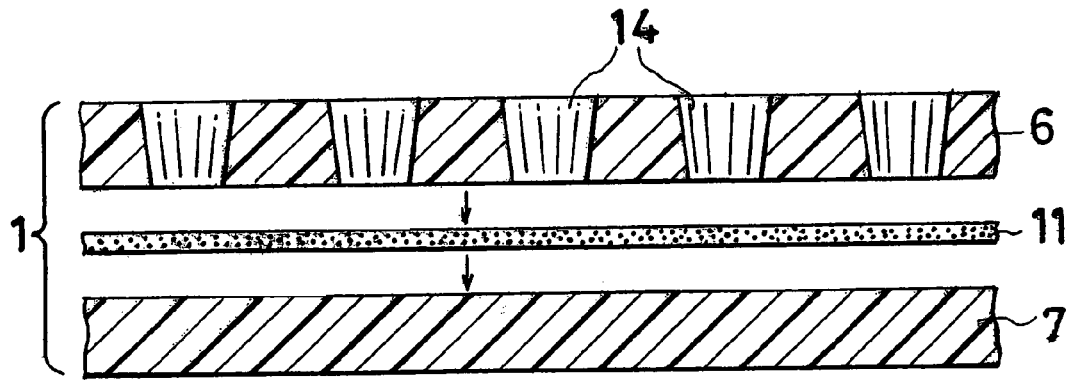

A solder ball assembly according to the present invention can be manufactured by a method including laminating a first and a second heat-resisting sheet 6, 7 with an adherent layer 11 disposed between the two sheets 6, 7 and forming holes 2 from one side of the first heat-resisting sheet 6 as shown FIGS. 5A and 5B, or by a method comprising forming through-holes 14 in a first heat-resisting sheet 6 and laminating the first heat-resisting sheet 6 to a second heat-resisting sheet 7 with an adherent layer 11 disposed between the two sheets 6, 7 as shown in FIGS. 6A and 6B.

Figure 6C:
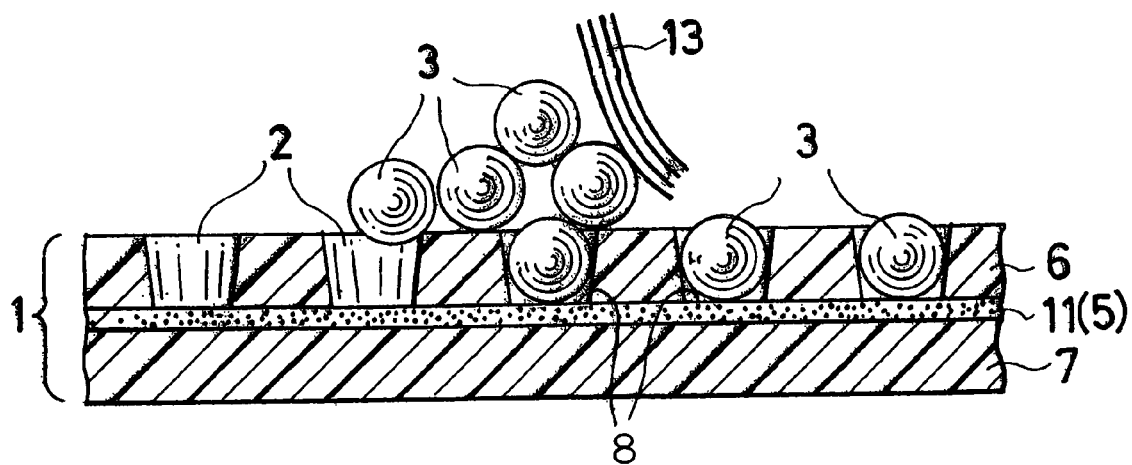

Thus, by either method, a multilayered heat-resisting sheet 1 having holes 2 and comprising a first and a second heat-resisting sheet 6, 7 which are bonded through an adherent layer 11 (or 5) disposed between the sheets 6, 7 is formed. In the former method, as shown in FIG. 5B, the holes 2 have a depth sufficient for them to reach or usually pass through the adherent layer 5 so that the adherent layer 5 is exposed to the interior of each hole 2 on the bottom or usually on the wall 4 of the hole 2. In the latter method, as shown in FIG. 6C, the adherent layer 5 is exposed to the interior of each hole 2 on the bottom thereof, with the holes 2 being formed by laminating a first heat-resisting sheet 6 having through-holes 14 and a second heat-resisting sheet 7 with an adherent layer 11 disposed between the sheets 6, 7. The adherent layer 5 or 11 serves to bond the first and second heat-resisting sheets 6, 7 to each other in either method.

The formation of blind holes 2 or through-holes 14 in the laminated multilayered heat-resisting sheet 1 or in the first heat-resisting sheet 6, respectively, may be performed by various methods including drilling, electric spark machining, punching, photolithographic machining using a photoresist, and laser machining. The most suitable method is laser machining (as depicted in FIGS. 5B and 6A by a laser beam machining tool 12) due to its very fast machining speed and good accuracy, thereby making it possible to accurately form a number of minute holes in an extremely short time. The resulting holes 2 are formed in the same positions as the electrodes of a substrate on which solder bumps are to be formed.

Figure 5C:
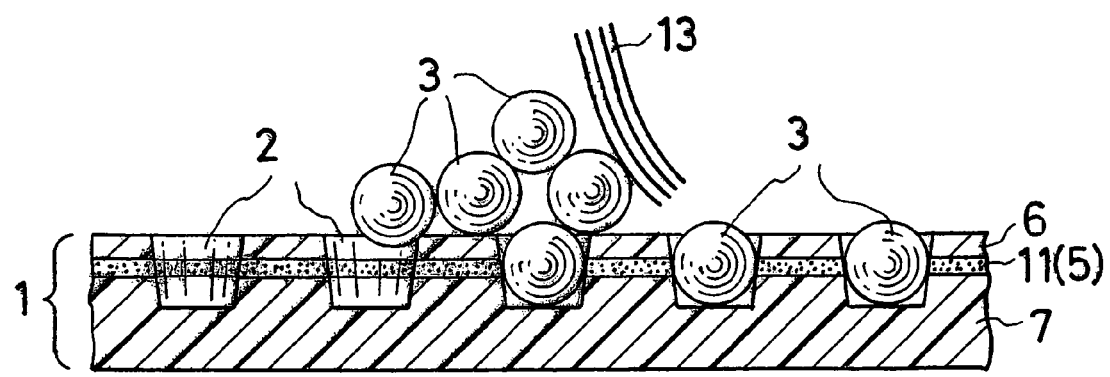

Subsequently, a solder ball 3 is placed into each hole 2 and held therein by contact with the adherent layer 5 which is exposed to the interior of each hole 2 on the wall and/or bottom thereof. This placement can be performed by simply dropping a solder ball 3 into each hole 2. Solder balls 3 can be easily and reliably dropped into the holes 2 by placing a number of solder balls 3 on the heat-resisting sheet 1 and then sweeping the solder balls 3 with a blade, a sheet of rubber, fabric, or paper, or a soft brush 13 as shown in FIGS. 5C and 6C. The resulting solder ball assembly may be examined by suitable means to determine if each hole 2 has received a solder ball 3.

In a solder ball assembly according to the present invention, solder balls 3 are held in holes 2 by the adhesive force of an adherent layer 5 exposed to the interior of each hole 2 on the wall 4 and/or bottom 8 thereof, so the solder balls 3 are prevented from becoming dislodged from the holes 2 upon application of moderate shaking or mechanical shocks. Therefore, a solder bump can be formed on each electrode of a substrate with certainty even if the substrate has a number of extremely minute electrodes, as is the case with a semiconductor element. Also, it becomes possible to store and transport a number of such solder ball assemblies while they are stacked on one another, particularly when each of them is protected by a covering, and they are ready for use to form solder bumps at any desired time. In addition, the solder ball assembly can form solder bumps easily and accurately in prescribed positions on a substrate without an expensive or special tool. Furthermore, since an adherent layer is readily formed in a heat-resisting sheet, the manufacturing costs of the solder ball assembly are not high. Thus, according to the present invention, it is possible to form solder bumps with improved reliability, productivity, and economy.

A solder ball assembly having solder balls disposed in the holes of a heat-resisting sheet can be used to form solder bumps by positioning the assembly on a substrate having electrodes on which solder bumps are to be formed in such a manner that each electrode of the substrate is aligned with and contacts a corresponding solder ball in one of the holes in the assembly. Thus, the assembly is turned upside down before it is positioned on the substrate. When a covering 10 is disposed atop the solder ball assembly as shown in FIG. 4, the covering 10 is removed from the assembly before the assembly is positioned on the substrate. Usually, the electrodes of the substrate are previously coated with a flux or solder paste by printing.

The substrate and the solder ball assembly positioned on the substrate are then heated so as to melt the solder balls within the holes in the assembly to form solder bumps. During heating, it is preferable to apply pressure to the solder ball assembly in order to guarantee contact of each solder ball with the corresponding electrode. For this purpose, heating may be performed in a hot press, for example. After the solder is solidified on each electrode, the heat-resisting sheet of the assembly is removed from the substrate, leaving solder bumps formed on the electrodes of the substrate.

The substrate may be a substrate for semiconductor packages such as BGA packages and CSP's or a substrate for use in TAB (tape automated bonding), or it may be a semiconductor element or silicon wafer for use in the face down bonding method. The substrate may also be a substrate for minute electrical components such as connectors.

EXAMPLES

A solder ball assembly having an adherent layer exposed to the interior of each hole 2 on the wall 4 of the hole 2 is manufactured by the method shown in FIGS. 5A to 5C. A multilayered heat-resisting sheet 1 is formed by disposing an adherent layer 11 between a first or upper heat-resisting sheet 6 and a second or lower heat-resisting sheet 7 and bonding the two sheets to each other by the adhesion of the adherent layer 11 (FIG. 5A). Tapered blind holes 2 having a circular shape in horizontal cross section are formed at prescribed positions in the multilayered heat-resisting sheet 1 from the side of the first heat-resisting 6 using a laser beam machining tool 12 (FIG. 5B). The adherent layer 11 (or 5 in the multilayered sheet 1) is exposed to the interior of each hole 2 on the wall 4 thereof. The diameter and depth of each hole 2 are such that a solder ball 3 can be easily inserted into the hole 2 and contact the exposed adherent layer 5 where it forms a portion of the wall 4 of the hole 2. In this example, the depth of each hole 2 is at least the radius of the solder ball 3 but at most 90% the diameter of the solder ball 3. A number of solder balls 3 are placed on the multilayered heat-resisting sheet 1 having holes 2 and swept by a soft brush 13 to insert a solder ball 3 into each hole 2 (FIG. 5C). In each hole 2, a solder ball 3 is held by the adhesion of the adherent layer 5 exposed to the interior of the hole 2 on the wall 4 thereof.

Another solder ball assembly having an adherent layer exposed to the interior of each hole 2 on the bottom thereof is manufactured by the method shown in FIGS. 6A to 6C. A first heat-resisting sheet 6 having a thickness greater than or equal to the radius of solder balls to be used in the solder ball assembly but smaller than the diameter of the solder balls is prepared, and tapered through-holes 14 having a circular horizontal cross section are formed in the first sheet 6 at prescribed positions using a laser beam machining tool 12 (FIG. 6A). The diameter of the through-holes 14 is selected such that solder balls can be easily inserted therein.

A multilayered heat-resisting sheet 1 is then formed by disposing an adherent layer 11 between the first or upper heat-resisting sheet 6 having through-holes 14 and a second or lower heat-resisting sheet 7 and bonding the two sheets to each other by the adhesion of the adherent layer 11 (FIG. 6B). The through-holes 14 in the first heat-resisting sheet 6 are closed off at their lower ends by the adherent layer 11 and the second heat-resisting sheet 7 to form holes 2, and the adherent layer 11 (or 5 in the multilayered sheet 1) is exposed to the interior of each hole 2 on the bottom 8 thereof. In this example, the depth of each hole 2 is the same as the thickness of the first heat-resisting sheet 6 and it is at least the radius of the solder ball 3 and preferably at most 90% the diameter of the solder ball 3. A number of solder balls 3 are placed on the multilayered heat-resisting sheet 1 having the holes 2 and swept by a soft brush 13 to insert a solder ball 3 into each hole 2 (FIG. 6C). The solder balls 3 inserted into the holes 2 are held by the adhesion of the adherent layer 5 which is exposed to the interior of each hole 2 on the bottom 8 thereof.

To demonstrate a method for forming solder bumps according to the present invention, a semiconductor element having 1000 electrodes each with a diameter of 100 μm was used as a substrate, and a solder bump was formed on each electrode of the substrate using a solder ball assembly according to the present invention.

The solder ball assembly which was used was manufactured by a method as shown in FIGS. 6A to 6C. A polyester resin sheet having a thickness of 50 μm was used as a first heat-resisting sheet, and 1000 tapered through-holes were formed in the first heat-resisting sheet by laser machining in the same positions as the electrodes of the semiconductor element. The nominal diameter of each through-hole formed in the first sheet was 120 μm on the top surface of the sheet and 90 μm on the bottom surface of the sheet. The bottom of each through-hole of the first heat-resisting sheet was closed off by attaching the first heat-resisting sheet to a second heat-resisting sheet through an adherent layer disposed between the first and second heat-resisting sheets. The second heat-resisting sheet comprised another polyester resin sheet which was thicker than the first heat-resisting sheet. The adherent layer used was made of an acrylic adhesive material and had a thickness of 10 μm. Thus, a multilayered heat-resisting sheet having tapered blind holes with a depth of 50 μm and an adherent layer exposed to the interior of each hole on the bottom thereof was obtained. Thereafter, a lead-free solder ball made of an Sn-3 Ag-0.5 Cu alloy having a diameter of 100 μm was inserted into each hole by placing a number of solder balls on the multilayered heat-resisting sheet and sweeping them with a soft brush. Although the upper portion of a solder ball received in each hole projected above the heat-resisting sheet, the solder ball was held in the corresponding hole by the adherent layer exposed to the interior of each hole on the bottom thereof. A covering of a polyester film having a very slight adhesion was placed on the first heat-resisting sheet to cover the solder balls contained therein.

After the covering was removed from the resulting solder ball assembly manufactured in this manner to expose the solder balls, the assembly was placed upside down on the above-described substrate (semiconductor element) having 1000 electrodes, which had been coated with a flux. The assembly was positioned on the substrate in such a manner that each solder ball disposed in one of the holes in the assembly contacted the corresponding electrode of the substrate. The substrate and the solder ball assembly were then heated in a hot press at a temperature of 230° C. and a pressure of 5 kgf for 15 seconds to melt the solder balls within the holes of the assembly and transform them into solder bumps. After cooling, the heat-resisting sheet of the assembly was removed from the substrate. It was confirmed by examination of the substrate that solder bumps were formed on all the electrodes of the substrate.

Although the present invention has been described with respect to preferred embodiments, they are merely illustrative and not intended to limit the present invention. It should be understood by those skilled in the art that various modifications of the embodiments described above can be made without departing from the scope of the present invention as set forth in the claims.

What is claimed is:

1. A solder ball assembly for use in the formation of solder bumps comprising a heat-resisting sheet having a plurality of holes and comprising first and second heat-resisting layers, a solder ball disposed in each hole, an adherent layer sandwiched between the first and second heat-resisting layers and exposed to the interior of each hole in such a manner that the adherent layer contacts and holds the solder ball in the hole, and a covering sheet spaced from the adherent layer and placed atop the heat-resisting sheet to cover the solder balls disposed in the holes.

2. A solder ball assembly as claimed in claim 1 wherein the heat-resisting sheet comprises a material selected from the group consisting of resins, metals, ceramics, paper, and combinations of two or more of these materials.

3. A solder ball assembly as claimed in claim 1 wherein the adherent layer is exposed to the interior of each hole on a wall of the hole.

4. A solder ball assembly as claimed in claim 1 wherein each hole has a bottom surface and the adherent layer is exposed to the interior of the hole on the bottom surface of the hole.

5. A solder ball assembly as claimed in claim 1 wherein each hole is straight and has a wall extending perpendicularly to a surface of the heat-resisting sheet.

6. A solder ball assembly as claimed in claim 1 wherein each hole is tapered and has a diameter which gradually decreases toward a bottom of the hole.

7. A solder ball assembly as claimed in claim 1 wherein each hole is a blind hole.

8. A solder ball assembly as claimed in claim 7 wherein the depth of each blind hole is at least one third the diameter but smaller than the diameter of the solder ball disposed therein.

9. A solder ball assembly as claimed in claim 7 wherein the depth of each blind hole is at least one half the diameter but smaller than the diameter of the solder ball disposed therein.

10. A method for forming solder bumps on electrodes of a substrate comprising placing a solder ball assembly as claimed in claim 1 with the covering sheet removed from the heat-resisting sheet upside down on a substrate having a plurality of electrodes with each electrode aligned with one of the holes in the solder ball assembly, heating the substrate and the solder ball assembly to melt the solder balls and transform them within the holes in the solder ball assembly into solder bumps attached to the electrodes, and removing the heat-resisting sheet of the solder ball assembly from the substrate.

11. A solder ball assembly as claimed in claim 1 wherein the adherent layer extends between adjoining holes inside the heat-resisting sheet.

12. A solder ball assembly as claimed in claim 1 wherein the adherent layer comprises a sheet of an adhesive material formed separately from the first and second heat-resisting layers.

13. A solder ball assembly as claimed in claim 1 wherein the adherent layer prevents the solder balls from falling out of the holes when the covering sheet is removed from the heat-resisting sheet and the assembly is oriented such that the solder balls would fall out of the holes in the absence of the adherent layer.

14. A solder ball assembly as claimed in claim 1 wherein each solder ball protrudes from the heat-resisting sheet and the covering sheet conforms to the shape of the protruding portions of the solder balls.

15. A solder ball assembly as claimed in claim 1 wherein the covering sheet directly contacts the solder balls.

16. A solder ball assembly for use in the formation of solder bumps comprising a heat-resisting sheet having a plurality of holes formed therein and having a first side facing upwards and a second side facing downwards and comprising first and second heat-resisting layers, each hole opening onto the second side of the heat-resisting sheet, a solder ball disposed in each hole and protruding from the hole at the second side of the heat-resisting sheet, and an adherent layer sandwiched between the first and second heat-resisting layers and spaced from the second side of the heat-resisting sheet and exposed to the interior of each hole in such a manner that the adherent layer contacts and holds the solder ball in the hole.

17. A solder ball assembly for use in the formation of solder bumps comprising a heat-resisting sheet having a plurality of holes formed therein and having a first side facing upwards and a second side facing downwards and comprising first and second heat-resisting layers, each hole opening onto the second side of the heat-resisting sheet, a solder ball disposed in each hole, and an adherent layer sandwiched between the first and second heat-resisting layers and spaced from the second side of the heat-resisting sheet and exposed to the interior of each hole and contacting and holding the solder ball in the hole and supporting the entire weight of the solder ball.

* * * * *